United States Patent [19]

Rose et al.

[11] 4,104,725

[45] Aug. 1, 1978

[54] PROGRAMMED CALCULATING INPUT SIGNAL MODULE FOR WAVEFORM MEASURING AND ANALYZING INSTRUMENT

[75] Inventors: Frederick A. Rose; Russell H. Nord; Roger E. Lidicker, all of Fort Atkinson, Wis.

[73] Assignee: Norland Corporation, Fort Atkinson, Wis.

[21] Appl. No.: 670,891

[22] Filed: Mar. 26, 1976

[51] Int. Cl.$^2$ .......................................... G01R 13/20
[52] U.S. Cl. ................................. 364/487; 324/77 R; 324/121 R; 364/579; 364/580; 364/900
[58] Field of Search ............... 235/151.31, 151.3, 152, 235/156; 313/391, 397, 364; 315/1; 324/97, 121, 158; 328/14; 340/324 A, 347 DA, 172.5; 445/1; 364/487, 579, 580, 900 MS File, 200 MS File; 324/77 R

[56] References Cited

U.S. PATENT DOCUMENTS

| | | | |
|---|---|---|---|
| 3,573,618 | 4/1971 | Dilley | 324/121 R |
| 3,662,373 | 5/1972 | Schumann | 324/121 R |
| 3,818,201 | 6/1974 | Hartwich et al. | 235/151.31 |
| 3,839,630 | 10/1974 | Olander, Jr. et al. | 235/156 |
| 3,921,166 | 11/1975 | Volpe | 340/324 A |
| 3,971,925 | 7/1976 | Wenninger et al. | 235/156 |

Primary Examiner—Malcolm A. Morrison
Assistant Examiner—Errol A. Krass

Attorney, Agent, or Firm—Andrus, Sceales, Starke & Sawall

[57] ABSTRACT

A waveform measuring and analyzing instrument includes a pair of plug-in receptacles adapted to receive signal acquisition and/or processing plug-in units. Each of the receptacles is wired to a waveform data memory and to a programmed processor. The program memory for the processor includes addresses assigned to the plug-in units for addressing a memory in the plug-in units which include plug-in type and status data and may include a plug-in resident programmed memory array in which a data calculation program is stored. The processor is connected to execute the software program in the plug-in unit. The plug-in resident calculating capability significantly expands the power and capability of the instrument to analyze and process particular waveform signals. The software programmed plug-in units may be formed with a pre-programmed, read-only memory or may employ a read-write memory with means for interfacing to a still larger external storage or memory. The instrument housing has an upper front control panel and a lower inter-active keyboard panel. The receptacles and plug-in units are rectangularly shaped and the receptacles are oriented horizontally in the housing to require sidewise placement or insertions of the plug-in units. A circuit board chamber is formed in the upper housing portion within which a stack of circuit boards are conveniently housed.

19 Claims, 4 Drawing Figures

PROGRAMMED CALCULATING INPUT SIGNAL MODULE FOR WAVEFORM MEASURING AND ANALYZING INSTRUMENT

BACKGROUND OF THE INVENTION

This invention relates to a waveform measuring and analyzing apparatus having resident software programmed processor means for displaying and analyzing waveforms.

Oscilloscopes are widely employed in the measurement and analysis of changing physical phenomena. The phenomena being analyzed may be repetitive or transient. Generally, a transducer develops an analog voltage signal in accordance with a sensed physical phenomena. The waveform may be derived from various sources and require varying coupling or interfacing means to the oscilloscope. Generally, conventional oscilloscopes have therefore employed plug-in interfacing modules with hardwired signal modifying components to develop an appropriate input signal to the oscilloscope. The plug-in units are wired with releasable connectors interconnecting the plug-in components to the oscilloscope components. The plug-in units are generally constructed of a rectangular box-like structure or housing with the controls and related indicia located for upright insertion into the oscilloscope housing or cabinet.

Digital oscilloscopes have recently been developed which include means for digitizing a signal, sotring such digitized signal in memory and producing a replica of the analog signal from such digitized data. Digital oscilloscopes may also be constructed with signal coupling receptacles or sockets to receive various signal modifying plug-in units which are constructed to accommodate various ranges and types of input signals.

A particularly satisfactory and improved waveform measuring and analyzing instrument incorporating all of the characteristics of digital oscilloscopes and transient recorders and in addition signal processing capability is disclosed in the copending application of Frederick A. Rose entitled "WAVEFORM MEASURING MEANS WITH RESIDENT PROGRAMMED PROCESSOR FOR CONTROLLED WAVEFORM DISPLAY AND WAVEFORM DATA REDUCTION AND CALCULATION" filed on Mar. 26, 1976, bearing Ser. No. 670,703, now U.S. Pat. No. 4,072,851, and assigned to the same assignee.

As more fully disclosed in the above application, the instrument includes a digital memory unit to store digitized waveform samples for display on an oscilloscope tube. The instrument includes a resident, special programmed processor. The memory unit and display unit include controllers with data communication transferred over hardwire interfacing, with program tables written by the processor. An integrated interactive keyboard is also provided with user operated data reduction and calculating keys which actuate the processor to execute an appropriate one of a plurality of corresponding program routines in the processor memory to do appropriate data reduction and calculation on the waveform array data in memory or on related data. The interactive keyboard has numeric entry keys and separate keys for the four basic arithmetic functions and for compound mathematic functions such as derivative, integrals, peak area calculation, rise time and the like for operation on full arrays in memory and on single valued data in registers. The function keys are directly identified by known arithmetic and compound function symbols employed in scientific analysis and discussion. Special keys are also provided for programmed positioning of cursors, operation of internal optional devices and entry of keystrokes in a special sequence "learn" memory bank. The instrument is constructed with the interactive keyboard programmed for generalized waveform display and analysis. Plug-in units may, of course, be provided in accordance with conventional practice to vary the signal coupling characteristics.

SUMMARY OF THE INVENTION

The present invention is particularly directed to a waveform measuring and analyzing apparatus having a digital waveform memory and a resident programmed processor and particularly an improved input signal coupling module or unit construction including a releasable connection means for a processor communicating bus means establishing communication between the processor and a software program memory array resident in a signal coupling module. The apparatus of this invention generally includes a signal connecting means for connection to any one of a variety of input signal modules or plug-in units for adapting the apparatus to various input signals and wherein the plug-in unit may incorporate or solely consist of a software program memory for unique data processing of the waveform data in the data memory array means by the main processor. Interactive keystroke means may also be resident in the signal coupling module for controlling the mode of execution of the program resident in the module.

More particularly, in accordance with a practical implementation of an embodiment of the present invention, the instrument includes a pair of plug-in receptacles adapted to receive signal acquisition or signal processing plug-in units. Each of the receptacles is wired to the data memory means and to the processor means with appropriate memory or other means of communication allocated to store data relative to the status and type of plug-in. In addition, the instrument's processor includes a plurality of memory location or addresses assigned to the plug-in units for addressing a software program memory, if present, in the plug-in unit. The plug-in units may therefore be constructed, in accordance with the present invention, with a plug-in resident programmed memory for interconnection and coupling to the instrument's processor means to introduce further data reduction and calculation function into the instrument. The instrument is thereby adapted to receive both conventional and novel type plug-in units including a conventional data acquisition unit, a data reduction unit only or a combined data acquisition and reduction unit.

The instrument processor program, in sequencing or upon an interrupt demand, invokes the program for monitoring the plug-in units. If the plug-in unit includes software a suitable message informs the processor which appropriately records its presence and the conditions under which the processor is to invoke execution of the internal software program of the plug-in unit.

The programmed plug-in units may be formed with a pre-programmed, read-only memory or in more sophisticated systems may employ a read-write memory with means for interfacing to a still larger external storage or memory unit for selectively writing programs into the plug-in memory.

In a particularly practical embodiment of the invention, the instrument housing includes an upper housing portion with a control panel and a lower housing portion housing the interactive keyboard. The plug-in units have generally rectangularly shaped housings, complementing correspondingly shaped sockets or receptacles in the front panel of the upper housing portion. The receptacles are oriented horizontally in the housing to require sidewise placement of the plug-in units, with a long horizontal length and a short vertical height. The controls and indicia are appropriately located across the plug-in units. The sidewise placement of the receptacles permits forming of a chamber in the upper housing portion within which a stack of circuit boards are conveniently housed.

The capability of the plug-in unit to contain calculating capability significantly expands the power and capability of the instrument to analyze and process particular signals. For example, various fields of investigation might require specialized data reduction which would not be otherwise employed in the more conventional laboratory. A separate plug-in unit might be provided for such specialized data reduction as Fourier transforms, waveform correlation, waveform fitting and the like. It would not be practical to build an instrument with such programs generally provided or resident within the instrument program memory. To provide specialized instruments, however, is also not desirable from economic considerations.

The present invention through the concept of the calculating plug-in means provides a very simple, reliable and practical method of interfacing special programs into the instrument.

BRIEF DESCRIPTION OF THE DRAWINGS

The drawings furnished herewith illustrate the best mode presently contemplated for carrying out the invention and in which the above advantages and features are clearly disclosed as well as others which will be readily understood from the following description of such embodiment.

In the drawings.

DESCRIPTION OF ILLUSTRATED EMBODIMENT

Figure 1:
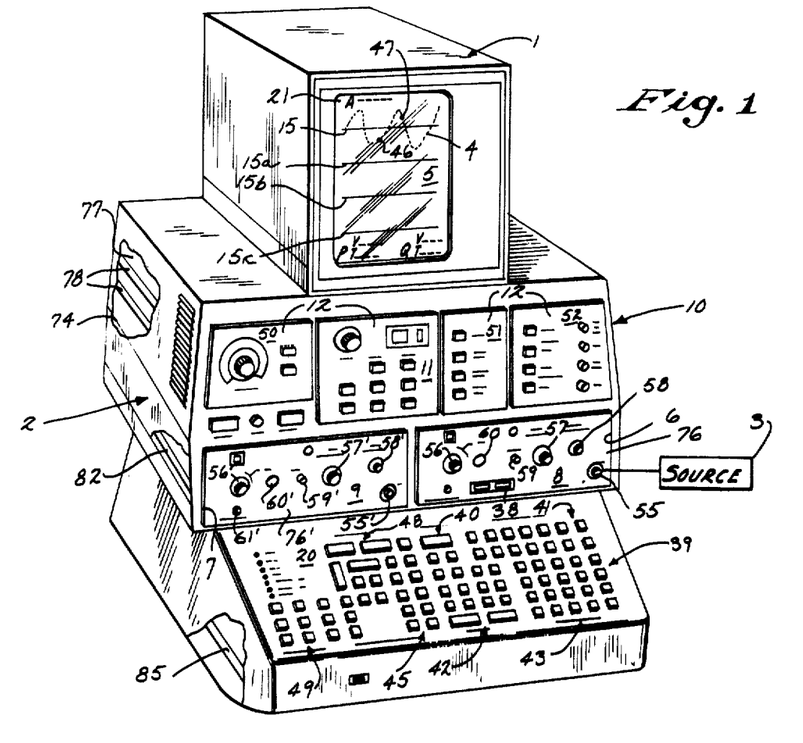
FIG. 1 is a pictorial view of an instrument constructed in accordance with the present invention with parts broken away to show details of construction.
Figure 4:
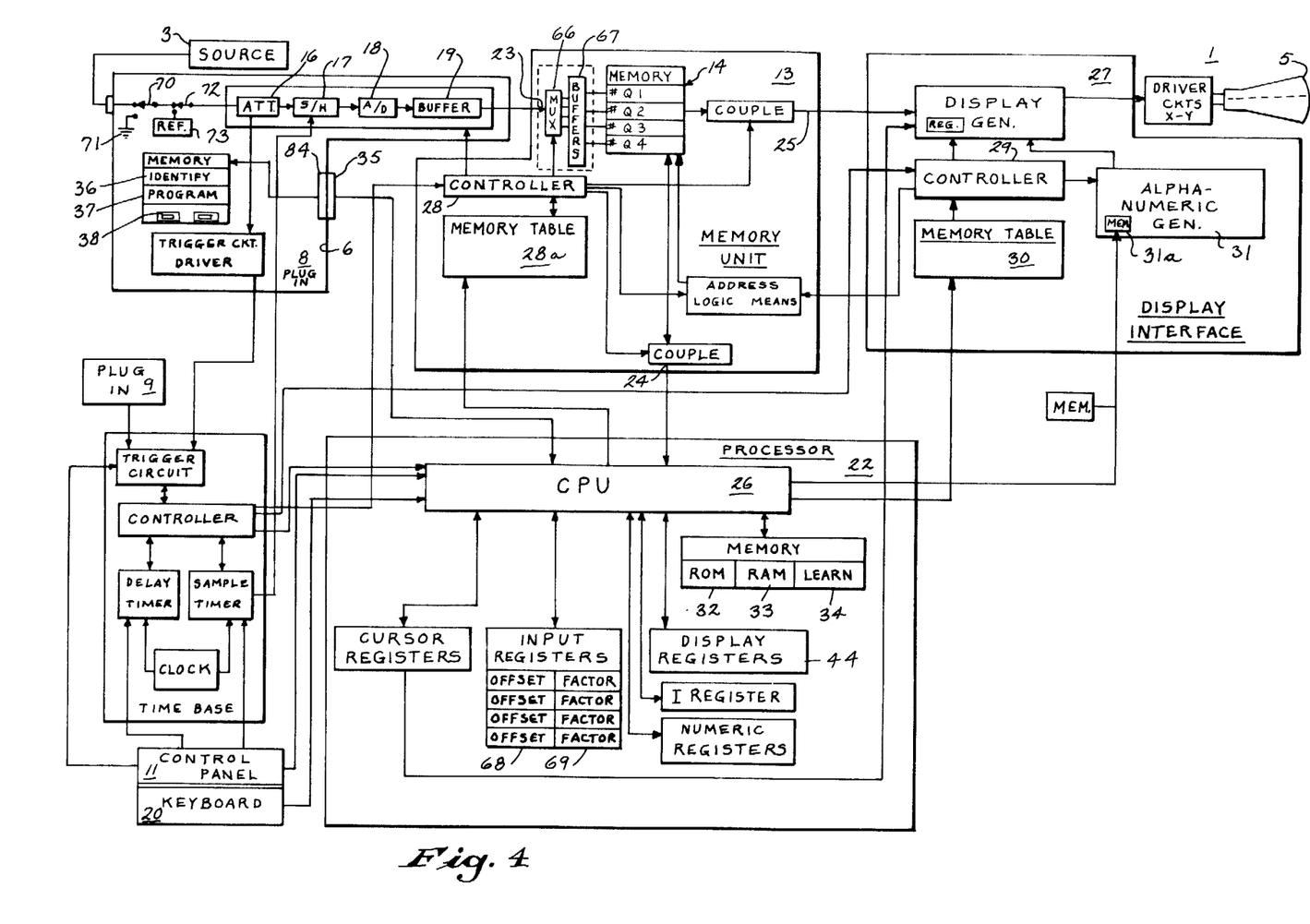
FIG. 4 is a block diagram of a preferred embodiment of the present invention.

Referring to the drawings and particularly to FIG. 1, a pictorial view of a waveform display and analyzing instrument constructed in accordance with the present invention is shown including a visual display unit 1 which is preferably a conventional high speed monitoring CRT oscilloscope. The unit 1 is connected to form an integrated element of a programmable processor unit 2 which is adapted to be connected to a waveform source 3 and drive the CRT unit 1 to display related waveforms 4 on the CRT screen 5 as more fully disclosed in the previously identified copending application. The present invention is particularly directed to the construction of a pair of waveform data acquisition receptacles 6 and 7 and related data acquisition plug-in units 8 and 9 permitting the user to uniquely tailor the instrument to the user's present and future needs. Generally the unit 2 is conveniently constructed with an upper housing portion 10 with a front control panel 11 including the receptacle openings 6 and 7 in the middle portion and with digital oscilloscope acquisition and display controls 12 in the upper portion. The waveform data is digitized into a series of digital equivalents which are stored in a digital memory unit 13, shown in FIG. 4, and returns them in analog form for display. As shown in FIG. 4, the digital memory unit 13 includes a memory array or bank 14 which may include four equal parts or arrays with appropriate individual ports for storing of up to four different waveforms, one in each part. The waveforms may be simultaneously displayed on the CRT screen in four vertically spaced quadrants as shown at 15, 15a, 15b, 15c in FIG. 1. The several individual arrays are identified for purposes of discussion by symbols Q1, Q2, Q3 and Q4.

Generally, the upper controls 12 in combination with plug-in mounted controls provide user determined time base and mode of sampling and digitizing. As shown in FIG. 4, input waveform signals are impressed on a signal sampling and digitizing interface unit including an attenuator 16, a sample and hold circuit 17, an analog to digital converter 18 and a coupling buffer register 19.

The digitized sample is stored in the memory bank 14 in accordance with user operated selection of the configuration of the memory parts.

Figure 2:
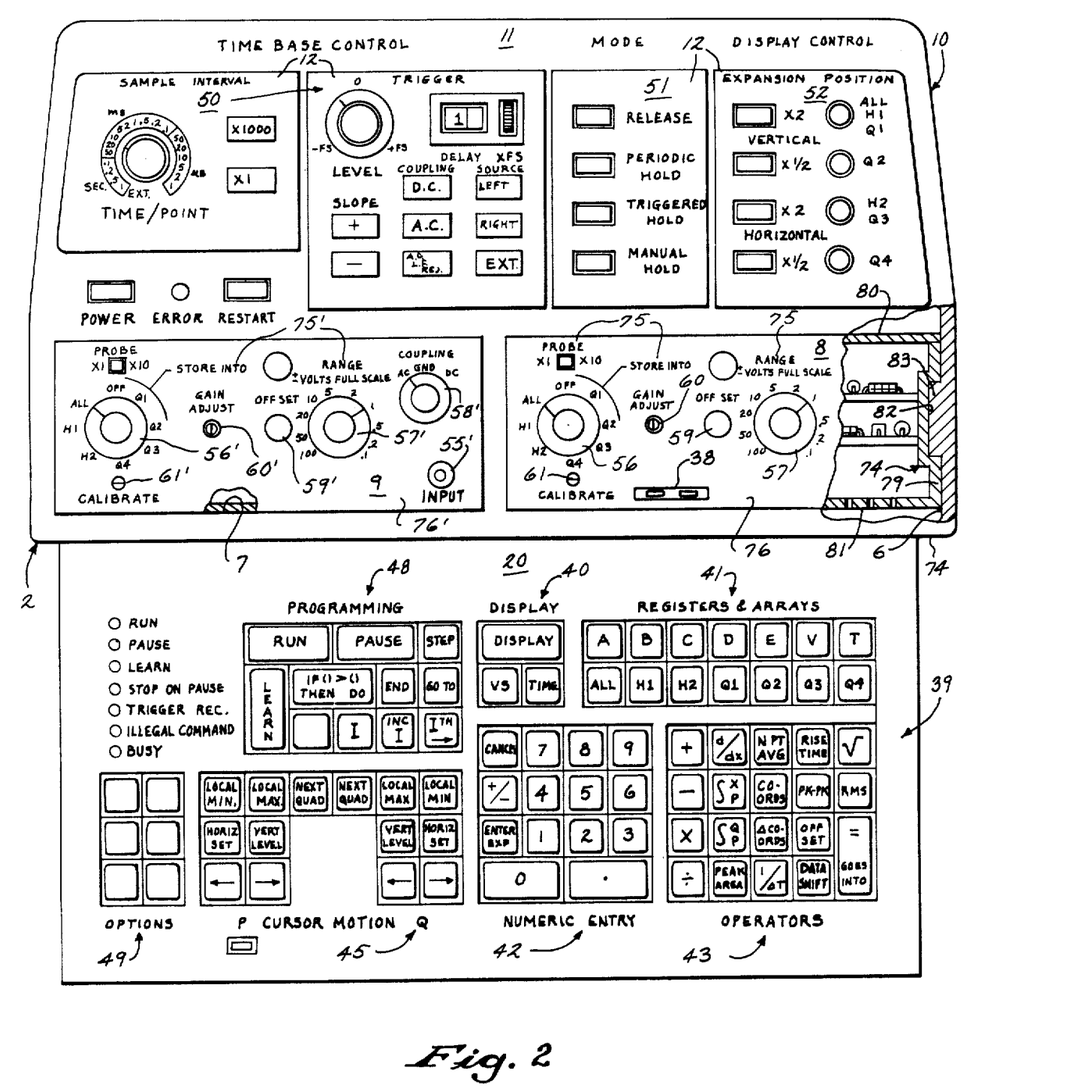
FIG. 2 is a front elevational view of the instrument shown in FIG. 1.

A forwardly extending lower keyboard panel 20 includes a plurality of interactive pre-programmed keys, as more fully shown in FIG. 2, for user operated control. The keyboard 20 provides user selection of the waveform display format and direct user controlled resident data reduction and calculation with respect to the waveform data. Alpha-numeric display 21 of pertinent information regarding the waveform may also be presented on the CRT screen 5.

The user operated keyboard keys are connected to a processor 22, shown in FIG. 4 for programmed execution of selected functions on the waveform data, with the keys particularly identified by known symbols for the various functions employed in waveform analysis and reduction.

Memory bank 14 includes three ports 23, 24 and 25 which are hardwired to receive and transmit data. Port 23 is a write-only port which is connected to the plug-in receptacles 6 and 7 for writing the digitized waveform data samples in memory locations as an array. Port 24 is a read-write port connected to the central processing unit CPU 26 of the processor 22 for communicating with the processor and permitting reduction and calculation of the waveform data. The port 25 is a read-only port connected to the display interfacing unit 27. The memory unit 13 includes a sequence controller 28 which has a memory table 28a connected to and written by the processor 22 to control the data acquisition routing into memory bank 14 and the mode of taking data. The memory controller 28 also maintains a record of the memory initial or zero time slot for each array in relationship to the real addresses of the memory bank. Thus, the sampled data is placed in memory bank 14 in the first time slot following that last filled with data such that the zero time slot for any given array varies with the location of the last input. The controller 28 insures that whenever a particular data location is requested, the proper data sample is read out. A hardwired controller 28 provides a simple and reliable sequencing of the memory unit. If desired, a separate software programmed processor having a read-write memory bank could, of course, be employed. Thus, "memory table" is generically used to define any type of control means which can itself be controlled by being set or written by the processor 22.

The display interfacing unit 27 similarly includes a sequence controller 29 with a memory table 30 for controlling the waveform display format. An alphanumeric generator 31 is also provided for generating display of alphanumeric information on the CRT screen 5 in accordance with information written by processor 22 into an integral alphanumeric memory 31a within the generator 31. Table 30 is written by the processor 22 to control the waveform numeric information presented in accordance with the user operation of the interactive panels. The processor 22 generally includes the CPU 26 connected to the front control panel 11 and to the keyboard panel 20 and to the plug-in receptacles 6 and 7. The processor 22 includes a program memory 32 which may be a read-only memory including the basic program loop for the processor 22 and various programs for the several user operated inputs of panels 11 and 20 and hereinafter described. A scratch pad memory 33 is also connected to the CPU 26 for the manipulation of data by the processor. A special "learn" memory 34 is also provided to permit programming of the several user operated inputs.

The processor 22 is also coupled through a processor bus connection terminating in a bus connector 35 at the receptacles 6 and 7 to a type identifying and control memory bank or unit 36 which is resident in the plug-in units 8 and 9. The memory bank 36 generally contains various identifying and input condition data. The several memories of the plug-in units are designed as part of the sequence of location addresses which are all available to the processor 22 for communication with the plug-in units, either for reading and/or writing depending upon the particular function and design. In accordance with the present invention, the plug-in units 8 and 9 may be of any one of three types including a conventional modifying and coupling plug-in for placing of digitized data in the data memory, a data calculating plug-in for processing the data in the data memory in a particularly unique way, and a combined calculating and acquisition plug-in for carrrying out both functions of the first two types of plug-ins, the latter two types will be generically referred to as calculating plug-in units. The memory unit 36 of plug-in units 8 and/or 9 having calculating capability includes a software program memory array 37 connected through the bus connector 35 to the processor 22 and storing one or more data reduction and calculating software programs for execution by the processor 22. As shown in FIGS. 1-4, the plug-in units 8 and 9 may also include unique interactive keys 38 for selective call-up of the software program or programs resident in the plug-in units. Such unique calculating plug-in units significantly expand the capability and power of the instrument by permitting the tailoring of the instrument to unique applications and to developing and changing needs and applications, as more fully developed hereinafter.

The lower keyboard panel 20 includes a plurality of interactive user operated keys 39 which are arranged and grouped to control various mathematical and logical processes within the instrument's capability. Generally, the keys 39 include a display key group or section 40 to initiate the display of data and a register-array section 41 for selection of the data to be displayed from the memory bank 14 and related registers. A numeric entry key group or section 42 provides for introduction of conventional decimal numbers into calculations and data reduction, particularly in connection with an operator section 43 for directly commanding execution of selected calculations and reduction of data. The lower panel 20 also includes a cursor motion control section 45 having a group of keys for positioning a pair of cursors 46 and 47 on screen 5. A programming or "learn" section 48 includes a group of keys which, conjointly with all of the other section keys of panel 20 and the plug-in keys 38, permits the user to insert a sequence of keystroke inputs into the learn memory 34 for selective and automatic execution of such sequence. An option section 49 includes inputs which are provided to permit specialized user-defined functions or controls such as special interfacing to external devices.

The upper panel 11 includes suitable time base and trigger control means 50 such as found in conventional digital oscilloscopes and transient recorders, as well as data acquisition mode control means 51 which provide for continuous sampling and display of a waveform, and various triggering modes for capturing the waveform in response to a controlled or sensed trigger signal. The illustrated upper panel 11 also includes a display positioning and expansion control section 52.

The unique interactive keyboard as more fully described in the previously identified application of F. A. Rose establishes a highly flexible decision-making instrument which is conveniently and readily controlled and operated by technical personnel without requiring special knowledge of computer processing machine language.

The present invention is particularly directed to the construction of the plug-in units 8 and 9 and the conjoint functioning with the resident programmed processor 22 and with the interactive keyboard 20 to further expand the data reduction and calculating capability of the instrument for rapid and accurate study of repetitive and transient waveforms. The instrument is therefore only described herein as required to fully describe the present invention. For a fuller description of the other aspects and features of the illustrated embodiments, reference may be made to the previously identified copending applications.

Referring particularly to FIG. 2, the plug-in units 8 and 9 may be similarly constructed and the illustrated plug-in unit 8 will be described with corresponding elements of unit 9 identified by corresponding primed numbers for simplicity of description.

In the illustrated embodiment of the invention, the plug-in unit 8 may include up to four separate signal channels and inputs, with one channel and its input connector 55 shown and described for simplicity of illustration and description. In multiple channel systems, a separate set of controls are provided on the front panel of the plug-in unit for control of the signal of each channel or inputs in accordance with conventional practice for multiple channel plug-in units in conventional or digital oscilloscopes. The waveform data from any input may be stored within the total memory array 14 or "ALL" within any one of the four quadrants or arrays $Q_1$ through $Q_4$, or within either one of two half sections or arrays identified by the symbols $H_1$ and $H_2$, where $H_1$ equals $Q_1$ and $Q_2$ and $H_2$ equals $Q_3$ and $Q_4$. A memory array selection control knob 56 is provided on the plug-in unit 8 for selecting the memory array into which the digitized signal for that input is routed.

The configuration of the memory bank 14 is more fully disclosed in the copending application entitled "RANDOM ACCESS MEMORY APPARATUS FOR A WAVEFORM MEASURING APPARATUS" of Smith and Rose, filed on Mar. 26, 1976, bearing Ser. No. 670,890 and assigned to the same assignee.

The plug-in unit 8 additionally includes a sensitivity control knob 57, and an A.C.-D.C. - Gnd. input control knob 58, with appropriate identifying indicia on the plug-in panel. An offset control knob 59 permits manual control of the offset of the waveform. A gain adjustment input 60 and a calibration jack 61 are also provided to properly scale the waveform signal. Each of the controls is operable to establish an appropriate encoded signal in the identifying memory unit 36 of the module or plug-in unit 8 for transmission to the processor via bus connector 35.

The sensitivity knob 57 is connected to set the attenuator 16 of the signal digitizing circuit shown in FIG. 4. The sample and hold unit 17 is connected to receive the attenuated waveform signal and transmit the sample to an analog to digital converter 18. The sampled signal is digitzed and place in the buffer register 19 for transfer and storage in memory unit 14. The controller 28 of the memory unit controls the transfer of digitized samples into the memory unit 14 in accordance with the instructions placed by the processor 22 in the memory table 28a.

The processor 22 also reads the setting of the memory array selection knob 56 as placed in the memory unit 36 and writes appropriate instructions in the table 28a. As shown in FIG. 4, a multiplexing unit 66 connects the signal channel and particularly the output of the sample digitizing unit to a set of buffers 67 which are connected to the ports of the several parts of memory bank 14. As noted previously, the controller 28 introduces the data into the next available time slot or memory location and maintains the necessary information to properly transmit the information in each memory array to the processor 22 for data reduction and to the display interface unit 27 for display.

The illustrated offset and attentuation input controls 59 and 57 provide for modifying the waveform data and the necessary values are placed in memory bank 36 and read by the processor 22. The processor 22 includes data modifying offset and factor array registers 68 and 69, a pair of which are provided for each of the arrays $Q_1$ through $Q_4$. The offset value selected by setting the offset control 59 is measured by the plug-in circuitry 16, 17, 18, 19, when commanded to do so by the processor 22 and then placed by the processor in the appropriate offset register 68. Similarly, the value selected by the setting of the attenuation control is placed by the processor in the factor register 69 for proper scaling of the waveform data. the digitized waveform signal is thereby stored in the memory locations with information as to the offset and attenuation of the signal stored in the appropriate set of registers 68 and 69 for that array.

As schematically shown, the input to the attenuator 16 is provided with a switch means 70 to analog ground 71 and a switch means 72 to a reference voltage 73. The processor activates the switch means 70 to ground the input and stores the digitized offset voltage, if any, in the offset register 68. This value is the sum of any offset inserted by the user and any drift which is present in the elements 16, 17, 18. The data in memory is corrected by modifying the corresponding off-set register 68 by this measured amount such that the instrument is drift free. A calibration program may be resident in the plug-in memory unit 36 and the processor programmed to automatically execute the calibration program at the end of the data sampling process. For calibration, the reference voltage is applied by switch 72 and the result of that measurement is used to correct the factor register 69 for that array to remove effects due to any variations in the attenuator 16 or the gain of either the sample and hold unit 17 or the analog-to-digital converter 18.

Registers 68 and 69 are preferably constructed as disclosed in a co-pending application entitled "FLOATING POINT REGISTERS FOR PROGRAMMED DIGITAL INSTRUMENTS" of Paul J. Kristof and Frederick A. Rose, filed on Mar. 26, 1976, bearing Ser. No. 670,722 and assigned to the same assignee.

If the plug-in unit 8 in addition to data acquisition means, or without such acquisition means, is of the unique calculating type, plug-in memory unit 36 includes corresponding identifying type data in the appropriate locations. The memory unit 36 of a calculating type plug-in includes instruction for execution of the software program or programs in the plug-in resident memory 37.

The resident memory 37 may be incorporated into the memory system of the processor 22 in any desired manner. Where a substantial number of different calculating plug-in units are to be available, "bank" switching of memory is particularly desirable.

Bank switching is accomplished in the presently described embodiment of the invention in the following way. A group of eight memory locations is assigned within the processor memory space to each of six possible plug-in receptacles or slots to be allowed in a fully expanded instrument. A fully expanded instrument is defined as containing the two plug-in slots 6 and 7 plus four more plug-in slots in an expansion chassis, not shown. These eight memory locations in each plug-in unit are the memories 36, which contain the previously described plug-in type information. Hence, a group of physically distinct and logically separate memory locations are assigned to each of the realizable plug-in slots. Therefore, the CPU can determine the existence of and, if present, can determine the type of a plut-in at each possible physical location, as well as the other identifying data necessary to appropriately incorporate the plug-in unit into the instrument.

The program memory 37 in each calculating plug-in is assigned the same logical addresses in the processor memory space as every other plug-in. To keep more than one plug-in from responding to those addresses when such a memory reference is made, each plug-in is provided with an enable function which allows the processor 22 to turn address recognition circuitry in each plug-in on and off. This enable circuitry is activated for example by the processor 22 through the writing of one of the locations in the memory 36.

By this means the bank of memory present in any one of the plug-ins 8 or 9 can be switched on to become an active part of the program memory of the instrument. Obviously only one bank may be activated at a time.

Other forms of memory assignment can of course also be employed within the teaching of the present invention.

The bank switching memory permits the design of a great number of different calculating plug-in units and increases flexibility in the design of the various calculating plug-in units.

If the plug-in unit 8 is a combined data acquisition and calculating type, the plug-in resident program may be executed upon termination of each data acquisition sequence. The instrument may, however, establish execution in response to a flag set by a separate keystroke provided by a key 38 or some other command condition created by the processor 22.

More particularly, the plug-in software program in the resident memory 37 may include a particular procedure or program which is too specialized for a general purpose waveform measuring and analyzing instrument. For example, a Fast Fourier Transform procedure may be desired in certain scientific studies. The resident program 37 of a plug-in unit may provide for calculating the frequency response by measuring the system response to a pulse input. Similarly, signal averaging, waveform correlations and fittings or any other known or suitable programs may be provided which are too specialized to warrant the cost of incorporation into the basic mainframe.

The additional interactive keys 38 function in the same general manner as any of the interactive keys 39 of the keyboard 20. Thus, a key 38 is encoded and read by the processor 22 which in turn finds the necessary software for the key in the plug-in resident program 37.

The keys 38 may be incorporated into the keystroke program placed in the special "learn" memory 34 of the instrument. The program within the plug-in resident memory 37 may thereby be incorporated into a repetitive program for rapid and continuous analytical waveform study.

The present invention thus significantly increases the scope of waveform measuring and analyzing instruments and in particular provides for highly specialized and unique processing without requiring the incorporation of these specialized functions into the general waveform instrument or of a separate specialized instrument. The present invention thus is particularly significant in providing an efficient and low cost instrument for practical implementation by relatively small laboratories, industrial research and production facilities and the like as well as the larger users.

In accordance with a practical aspect of the illustrated embodiment, the plug-in receptacles 6 and 7 are located within the instrument housing 74 in the lower portion of the front panel 11. The receptacles are formed with a long horizontal dimension extending across the front panel 11 and a short vertical dimension. The plug-in units 8 and 9, formed with similarly shaped housings 73, are inserted sidewise rather than in the more conventional upright position such as employed in oscilloscopes and like instruments. The control indicia 75 is written across the long dimension of the front plug-in wall or panel 76. The two receptacles 6 and 7 generally correspond to the width of the upper housing to provide a maximum front plug-in panel 76. The sidewise location of the plug-in units 8 and 9 develops a convenient upper chamber 77 above the plug-in receptacles 6 and 7 within which a plurality of relatively large circuit boards 78 are conveniently mounted. The circuit boards include the multiple elements and circuits for the memory unit 13, the display interface unit 27 and the processor 22. This arrangement is uniquely adapted to the physical incorporation of the instrument resident processor, in a compact integrated instrument housing.

Figure 3:
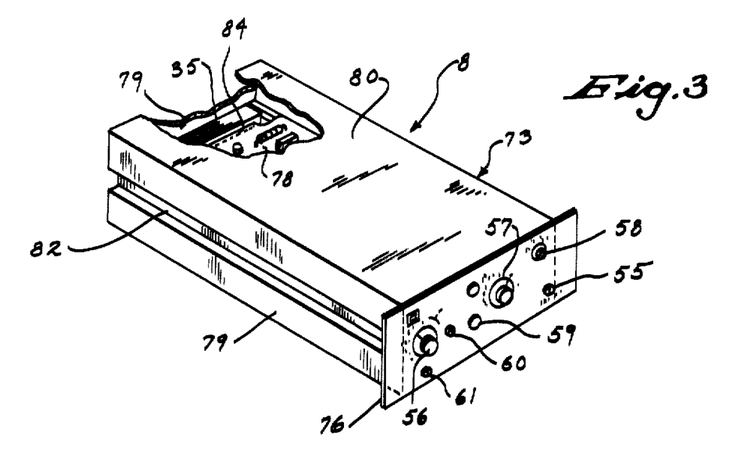
FIG. 3 is a pictorial view of the plug-in unit shown in FIGS. 1 and 2.

Referring to FIG. 3, the physical construction of plug-in unit 8 is generally illustrated. The plug-in housing 73 includes sidewalls 79 interconnected to a front panel wall 76 and a rear wall 79. A top wall 80 and a lower apertured wall 81 are secured to complete the housing. The wall 81 provides for air flow rearsardly through the housing and out through the back wall. The sidewalls 79 have slide recesses 82 mating with corresponding slides 83 in the instrument housing 74. The signal processing and memory components of the plug-in unit are mounted on circuit boards 78 within the plug-in housing 73.

The rear wall 79 of the plug-in housing is provided with one-half of a conventional multiple pinned releasable connector 84, the opposite instrument half of which is affixed in the base or rear wall of the receptacles 6 and 7 in instrument housing 74. The instrument portion of connector 84 forms the appropriate bus connection 35 to the memory unit 13 and to the processor 22 on the circuit boards in the upper chamber.

A circuit board 85 for the interactive keyboard 20 is conveniently housed in the bottom portion of the instrument housing beneath the panel 20.

Although the structural arrangement of the housing and the associated plug-in units and circuit boards is not critical to the present invention, the embodiment is of practical significance in the provision of a compact instrument which can be conveniently placed within a laboratory and similar locations for convenient use with other devices and where space limitations may be encountered.

The present invention thus provides a simple and relatively inexpensive means for tailoring the generalized waveform measuring and analyzing instrument to relatively particular and specialized need of waveform analysis and for meeting changing modes and needs of waveform analysis by design and provision of new and up-dated plug-in units.

Various modes of carrying out the invention are contemplated as being within the scope of the following claims, particularly pointing out and distinctly claiming the subject matter which is regarded as the invention.

We claim:

1. A waveform measuring and analyzing instrument having a visual display output means and a digital memory array means for storage of the coordinates of a digital representation of a waveform, a data acquisition means connected to said memory array means for establishing digitized waveform signals of a waveform, a programmed processor having a program memory and an interactive user operated control means for the processor for programmed data reduction of the data in the memory array means, the improvement in the data acquisition means comprising a releasably connected signal coupling unit in said instrument having a first bus connection means including a hardware bus connector and a software bus connector connected to the processor and to the data acquisition means, plug-in modules having a single integrated support having second connection means including a hardware bus connector and a software bus connector for connection to said first bus connection means, said integrated support being insertable as a unit into said coupling unit and establishing the interconnection of said corresponding connectors, said plug-in unit including a resident software program means connected to the software bus connector of said plug-in module and a hardware signal processing means connected to the hardware bus connector of said plug-in module, said hardware bus connector and said software bus connector of said first connection means establishing transmission of signals between said processor and said module resident software program memory means and said hardware signal processing means for processing of data in said hardware signal processing means and for executing a software program resident in said module.

2. The instrument of claim 1 wherein said module includes user operated control means, and said coupling unit includes means to monitor the presence of said user operated control means resident in said module.

3. The instrument of claim 2 wherein said module resident control means controls execution of the software programs in the module resident memory means.

4. The instrument of claim 3 wherein said digital memory array means includes a plurality of input ports connected one each to each of a similar plurality of memory arrays in said memory means, said memory array means includes a controller having a program table of instructions for controlling connection of the input ports to said data acquisition means, said controller having logic routing means for selectively entering the waveform signals in any of the plurality of memory arrays, and said logic routing means being controlled by said controller in accordance with the program table established by said processor to enter the signals into a selected array, said module having operator control means programmed for selecting the input port to receive the waveform signal for entering the waveform signals into said memory array means, said processor responding to the operator control means to set the instructions in said program table of instructions in accordance with the operator control means.

5. A waveform measuring and analyzing instrument having a visual display means, comprising a digitized memory array means for storage of the coordinates of waveform data in digitized form for display by said display means, data receptacle means connected to said memory means for transmitting digitized waveform signals of a waveform, a programmed processor having a program memory and connected to said memory means and to said data receptacle means for selectively entering said digitized waveform signal in said memory array means, an interactive user operated control means having a plurality of keystroke means for programmed basic arithmetic and compound mathematic functions for reduction and calculation with at least one of the waveform data signals in the memory array means being read by the processor as an argument of the function of the keystroke means, said data receptacle means including a first part of a two part releasable signal connector unit, data modules each having a single integrated support and a complementing part of the two part connector unit for connection to said first part and having a resident memory and resident signal processing hardware on said support, said programmed processor including addresses assigned to a software program memory resident in a module and being operable to execute the software program in such software program memory upon command and to transmit and receive signals from said signal processing hardware.

6. The waveform measuring and analyzing instrument of claim 5 wherein certain of said modules include user operated interactive control means, and said memory resident in the module includes software for said interactive control means, and said processor being operable to respond to said interactive control means.

7. A waveform measuring and analyzing instrument having a visual display means comprising digitized waveform memory means for storage of coordinates of a visual display in digitized form, signal coupling modules each having waveform signal processing hardware and a resident software program means for reduction and calculation with the signal data as an entry, said modules each having one part of a two part circuit connector unit including a data bus connector to the hardware and a software bus connector to the resident program means, a data acquisition input means connected to said waveform memory means, the second part of said two part connector unit including a data bus connector coupled to the first part and to the data acquisition input for entering the digitized representation of a waveform, a programmed processor having a program memory for actuating said display means and said data acquisition input means for selective entry of said digitized waveform signal in said waveform memory means, said processor being constructed to execute software programs in said module and to transmit signals to and from said resident hardware.

8. The waveform measuring and analyzing instrument of claim 7 having an interactive user operated control means having a plurality of input means for each of a plurality of basic mathematical functions for reduction and calculation with the data signals in the memory array means as an entry, said modules including user operated input means for selecting a program resident in the module, and said processor including means responsive to actuation of said module input means to invoke the corresponding program in the module program memory.

9. The instrument of claim 7 wherein said input means includes socket means and said modules are plug-in units.

10. The instrument of claim 9 consisting of a pair of said socket means, each of said socket means having a plurality of signal channels, said memory means being arranged in a plurality of memory array segments each of which includes an input port and having a controller with logic routing table means for entry of the waveform signals into selected memory array segments, and said plug-in units including memory array segment selection means connected via said memory input ports to said processor, said logic routing table means being set by said processor.

11. The electrical measuring and analyzing instrument of claim 7 wherein said modules include releasable plug-in means for selective data acquisition and for data calculation, and wherein said data acquisition input means includes at least one plug-in receptacle means for receiving various data acquisition and data calculating plug-in means, said calculating plug-in means including a resident program memory means, said processor being programmed to read said resident program memory means for controlled processing said data in the data memory array means in accordance with said module resident program memory.

12. The instrument of claim 11 wherein said calculating plug-in means includes a resident memory bank programmed to establish reduction of data in said memory array means by said processor.

13. The instrument of claim 11 wherein said resident program memory means is programmable and said calculating plug-in means includes a memory write coupling means connected to said module resident program memory means for entering a program in said module resident program memory means.

14. The instrument of claim 13 including keystroke input means, said processor reading said keystroke input means and operable to process the waveform data in said waveform memory means in accordance with said keystroke input means and said plug-in resident program.

15. The instrument of claim 7 wherein said plug-in means includes status means for determining the operating condition of the data acquisition unit, said processor including program means for actuating said status means and storing modifying values for correction of stored data by such values.

16. The waveform measuring and analyzing instrument of claim 7 wherein said waveform memory means includes a plurality of memory storage arrays and input ports, one for each of said arrays, said modules being releasable plug-in means having a plurality of channels up the number of said ports for selective data acquisition and introduction of data into said ports, a waveform memory array selection means connected to select the connection of said channels to said ports, an attenuator value setting means, an offset vaule setting means, said processor reading the state of each said array selection means and said attenuator means and said offset means and establishing a routing table for said plurality of channels and storing the setting of the attenuator and offset means for each of said channels.

17. A waveform signal coupling component for releasable mounting within a receptacle in a waveform measuring and analyzing instrument, said instrument including a programmed processor having a processor bus means connected to a processor bus connection means, said coupling component comprising a unitary support means for releasable insertion into said receptacle, signal processing hardware mounted on said support means, functional identifying memory means mounted on said support means for identifying the function of the component, a software program memory array means mounted on said support means, and bus connection means connected to said hardware and to said identifying memory and to said memory array means and having a plurality of terminal means complementing said processor bus connection means of said instruments for releasable coupling thereto and thereby connecting of the hardware and identifying memory and memory array means to said processor.

18. The signal coupling component of claim 17 including interactive keystroke means encoded to software programs resident in said plug-in memory array, and said memory means having keystroke memory means connected to the software bus for coupling by said two part connector to said processor.

19. The coupling component of claim 17 wherein said support means includes a housing having a rectangular cross-section with a horizontal dimension substantially longer than the vertical dimension, and said housing having a front panel with visual information presented in a horizontal line.

* * * * *

UNITED STATES PATENT AND TRADEMARK OFFICE
CERTIFICATE OF CORRECTION

PATENT NO. : 4,104,725
DATED : August 1, 1978
INVENTOR(S) : Frederick A. Rose et al It is certified that error appears in the above-identified patent and that said Letters Patent are hereby corrected as shown below:

Column 1, Line 30, after "signal" cancel "sotring" and insert --- storing ---;

Column 7, Line 25, after "and" cancel "place" and insert --- placed ---;

Column 7, Line 57, before "digitized" cancel "the" and insert --- The ---;

Column 10, Line 8, after "flow" cancel "rearsardly" and insert --- rearwardly ---;

Column 13, Line 26, after "offset" cancel "vaule" and insert --- value ---.
CLAIM 16

Signed and Sealed this

Thirteenth Day of March 1979

[SEAL]

Attest:

RUTH C. MASON
Attesting Officer

DONALD W. BANNER
Commissioner of Patents and Trademarks